(12) United States Patent
Fujiwara et al.

(10) Patent No.: US 10,276,579 B2
(45) Date of Patent: Apr. 30, 2019

(54) LAYOUT DESIGN FOR MANUFACTURING A MEMORY CELL

(71) Applicant: Taiwan Semiconductor Manufacturing Company Limited, Hsinchu (TW)

(72) Inventors: Hidehiro Fujiwara, Hsinchu (TW); Hung-Jen Liao, Hsinchu (TW); Hsien-Yu Pan, Hsinchu (TW); Yen-Huei Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/453,976

(22) Filed: Mar. 9, 2017

(65) Prior Publication Data

US 2017/0271342 A1    Sep. 21, 2017

Related U.S. Application Data

(60) Provisional application No. 62/309,617, filed on Mar. 17, 2016.

(51) Int. Cl.
| | |
|---|---|
| G11C 5/06 | (2006.01) |
| H01L 27/11 | (2006.01) |
| G11C 11/419 | (2006.01) |
| H01L 21/8234 | (2006.01) |
| H01L 23/528 | (2006.01) |
| H01L 27/02 | (2006.01) |
| G11C 11/412 | (2006.01) |
| G11C 11/418 | (2006.01) |

(52) U.S. Cl.
CPC ............ *H01L 27/1104* (2013.01); *G11C 5/06* (2013.01); *G11C 11/412* (2013.01); *G11C 11/419* (2013.01); *H01L 21/823475* (2013.01); *H01L 23/528* (2013.01); *H01L 27/0207* (2013.01); *G11C 11/418* (2013.01)

(58) Field of Classification Search
CPC ................................ G11C 5/06; G11C 11/412
USPC ....................................................... 365/154
See application file for complete search history.

(56) References Cited

U.S. PATENT DOCUMENTS

| | | | |
|---|---|---|---|
| 8,929,130 B1* | 1/2015 | Liaw .................... | G11C 11/419 365/154 |
| 2008/0151653 A1* | 6/2008 | Ishikura ................ | G11C 7/065 365/189.15 |

(Continued)

*Primary Examiner* — Hoai V Ho
*Assistant Examiner* — Jay W. Radke
(74) *Attorney, Agent, or Firm* — Jones Day

(57) ABSTRACT

Arrays of static random access memory (SRAM) cells and methods of fabricating the same are provided. A first communication path is disposed a first distance from an edge of the array and is operable to control access to SRAM cells of a first row of the array for write operations. A second communication path is disposed a second distance from the edge of the array and is operable to control access to SRAM cells of a second row of the array for write operations. The second distance is different than the first distance. A first conductive structure is disposed a third distance from the edge of the array and is operable to control access to the SRAM cells of the first row for read operations. A second conductive structure is disposed the third distance from the edge of the array and is operable to control access to the SRAM cells of the second row for read operations.

20 Claims, 19 Drawing Sheets

(56) References Cited

U.S. PATENT DOCUMENTS

| | | | |
|---|---|---|---|
| 2011/0068400 A1* | 3/2011 | Wang | G11C 11/412 |
| | | | 257/347 |
| 2013/0154027 A1* | 6/2013 | Liaw | H01L 27/1104 |
| | | | 257/390 |
| 2016/0027499 A1* | 1/2016 | Liaw | G11C 11/412 |
| | | | 365/154 |
| 2016/0163713 A1* | 6/2016 | Mojumder | G11C 5/063 |
| | | | 257/773 |

* cited by examiner

LAYOUT DESIGN FOR MANUFACTURING A MEMORY CELL

CROSS-REFERENCE TO RELATED APPLICATIONS

This application claims priority to U.S. Provisional Application No. 62/309,617, filed Mar. 17, 2016, entitled "Small WL RC 2P8T SRAM Cell for Single Nano-Meter Era," which is incorporated herein by reference in its entirety.

BACKGROUND

Static random access memory (SRAM) is commonly used in electronic devices. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a data bit. Additional transistors may be added to control the access to the transistors. SRAM cells are typically arranged as an array having rows and columns. Typically, each row of the SRAM cells is connected to a word line, which determines whether the current SRAM cell is selected or not. Each column of the SRAM cells is connected to a bit line (or a pair of bit lines), which is used for storing a data bit into a selected SRAM cell or reading a stored data bit from the selected SRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
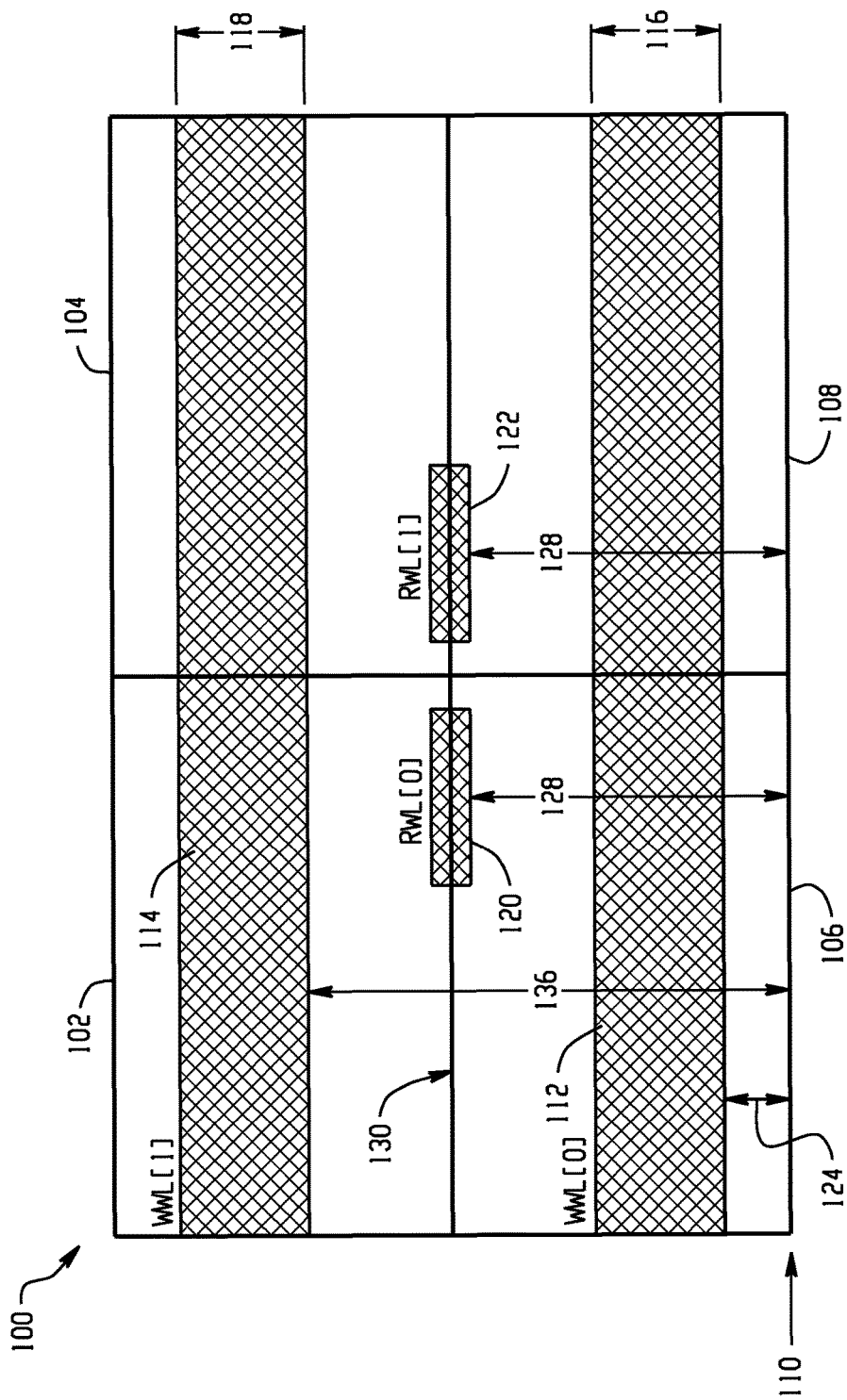
FIG. 1A depicts an example array of static random access memory (SRAM) cells arranged in rows and columns, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
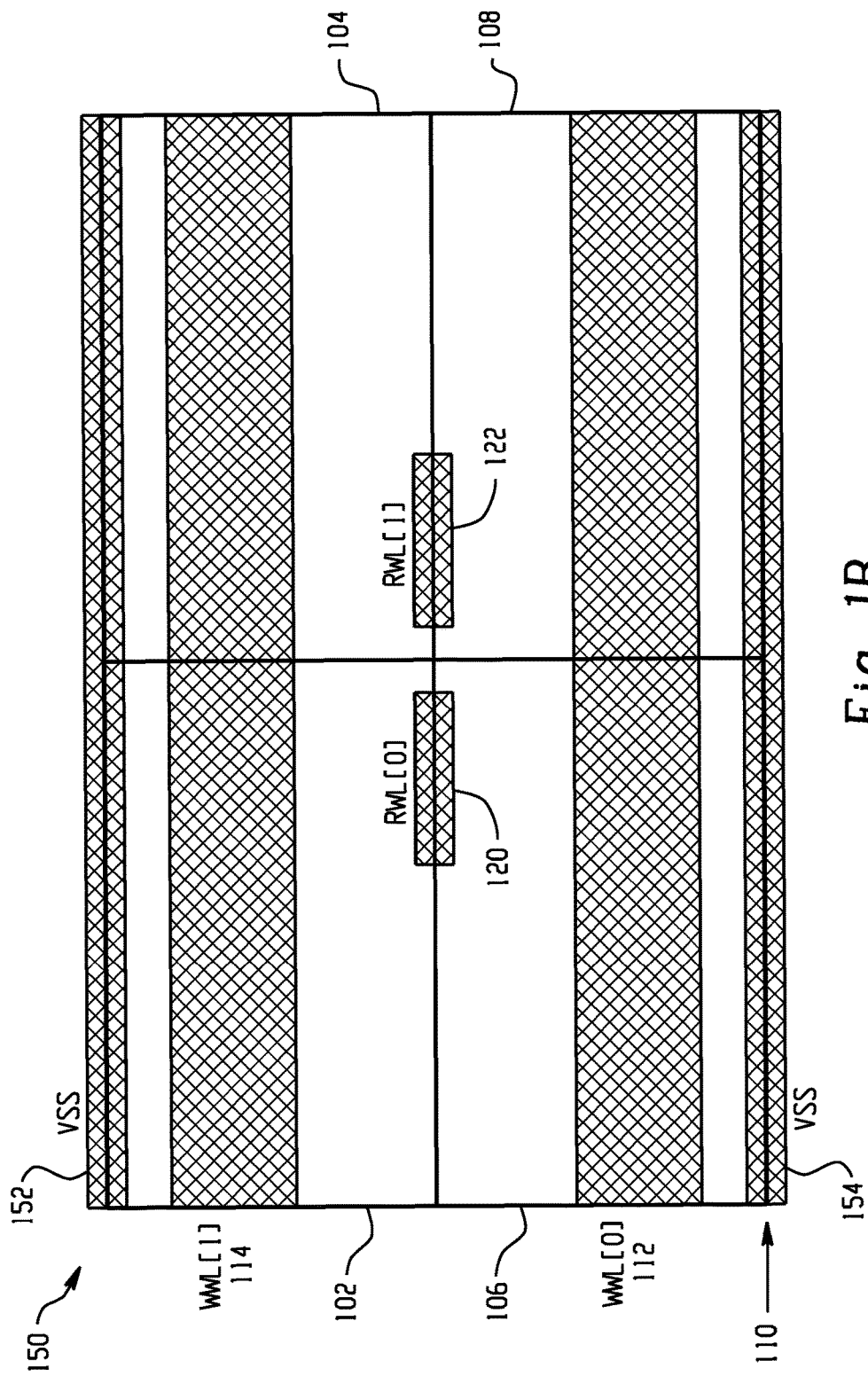
FIGS. 1B and 1C depict other example arrays of SRAM cells, in accordance with some embodiments.
Figure 1C:
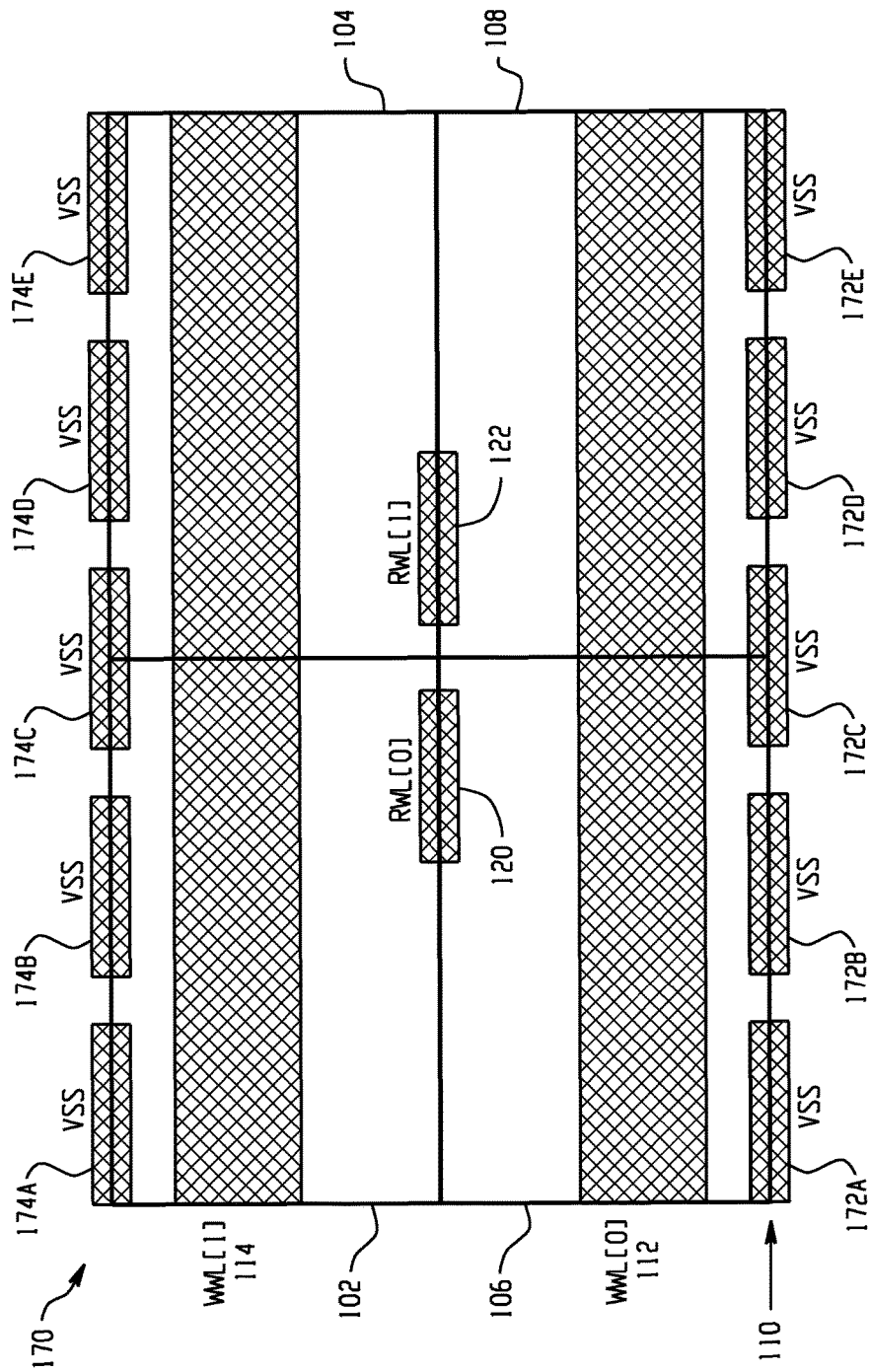

FIG. 1A illustrates one example of a two-port SRAM array 100 including a plurality of two-port SRAM cells 102, 104, 106, 108, in accordance with some embodiments. The SRAM cells 102, 104, 106, 108 are arranged in a number of rows and a number of columns. The SRAM cells 106, 108 are coupled to a first communication path that extends horizontally across the memory array 100 (e.g., in an x-direction). In the embodiments of FIGS. 1A-1C, the first communication path is a write word line WWL[0] 112, as shown in these figures. The disclosure is not limited to these embodiments, however, and in other embodiments, the first communication path need not be a write word line. The write word line WWL[0] 112 controls access to the SRAM cells 106, 108 for write operations. Likewise, the SRAM cells 102, 104 are coupled to a second communication path that extends horizontally across the memory array 100. In the embodiments of FIGS. 1A-1C, the second communication path is a write word line WWL[1] 114, as shown in these figures. The disclosure is not limited to these embodiments, however, and in other embodiments, the second communication path need not be a write word line. The write word line WWL[1] 114 controls access to the SRAM cells 102, 104 for write operations.

The SRAM cells 106, 108 are also coupled to a read word line RWL[0] 120 that is disposed on a boundary 130 that separates the rows of the array 100. The read word line RWL[0] 120 comprises a first conductive structure (e.g., a metal structure) that is operable to control access to the SRAM cells 106, 108 for read operations. The SRAM cells 102, 104 are likewise coupled to a read word line RWL[1] 122 that is disposed on the boundary 130 between the rows of the array 100. The read word line RWL[1] 122 comprises a second conductive structure that is operable to control access to the SRAM cells 102, 104 for read operations.

In the example of FIG. 1A, the read word lines RWL[0] and RWL[1] comprise conductive islands 120, 122 with lengths that are less than the lengths of the write word lines WWL[0] and WWL[1]. In examples, the write word lines 112, 114 and the read word lines 120, 122 are formed within a same conductive layer of a semiconductor structure. Thus, for instance, semiconductor layers of the SRAM cells 102, 104, 106, 108 are formed on a substrate, and the word lines 112, 114, 120, 122 are formed within a single conductive layer (e.g., an "M2" conductive layer formed over an "M1" conductive layer) that overlays the semiconductor layers, in examples. In other embodiments of the disclosure, the SRAM cells 102, 104, 106, 108 and the word lines 112, 114, 120, 122 are formed within different layers of a semiconductor structure.

Each of the SRAM cells 102, 104, 106, 108 is further coupled to multiple bit lines. The multiple bit lines include a pair of complementary write bit lines (referred to herein as "WBL" and "WBLB") and a read bit line (referred to herein as "RBL"). In examples, such bit lines extend vertically across the memory array (e.g., in a y-direction). For clarity, such bit lines are not depicted in the illustration of FIG. 1A. To illustrate example connections of the bit lines to an SRAM cell, reference is made to FIG. 2. This figure is a schematic diagram of a two-port, eight-transistor (2P8T) SRAM cell 2, in accordance with some embodiments.

The SRAM cell 2 includes write-port pull-up transistors Q1 and Q2, write-port pull-down transistors Q3 and Q4, and write-port pass-gate transistors Q5 and Q6. The drains of pull-up transistor Q2 and pull-down transistor Q4 are interconnected, and the drains of pull-up transistor Q1 and pull-down transistor Q3 are interconnected. Transistors Q1, Q2, Q3, and Q4 are cross-coupled to form a data latch. Storage node Node_1 of the data latch is coupled to write bit line WBL through write-port pass-gate transistor Q6, while storage node Node_2 is coupled to write bit line WBLB through write-port pass-gate transistor Q5. Storage nodes Node_1 and Node_2 are complementary nodes that are often at opposite logic levels (logic high or logic low). Gates 10 and 12 of write-port pass-gate transistors Q6 and Q5, respectively, are connected to write word line WWL. Example write word lines (e.g., WWL[0] 112 and WWL[1] 114) of SRAM cells are illustrated in FIG. 1A. SRAM cell 2 is coupled between operation voltages VDD and VSS (e.g., ground voltage level).

Transistors Q1, Q2, Q3, Q4, Q5, and Q6 form the write-ports of SRAM cell 2, with transistors Q6, Q2, and Q4 forming a first half write-port, and transistors Q5, Q1, and Q3 forming a second half write-port. The write-ports are used for writing data into SRAM cell 2. The reading of the data stored in SRAM cell 2 is performed through read-port pull-down transistor Q8 and read-port pass-gate transistor Q7. Gate 14 of read-port pass-gate transistor Q7 is connected to read word line RWL, which is electrically and physically separated from write word line WWL. Example read word lines (e.g., RWL[0] 120 and RWL[1] 122) of SRAM cells are illustrated in FIG. 1A. When write operations are performed, read-port pass-gate transistor Q7 is turned off, and write-port pass-gate transistors Q5 and Q6 are turned on. The data are thus written into SRAM cell 2 through write bit lines WBL and WBLB. Conversely, when read operations are performed, write-port pass-gate transistors Q5 and Q6 are turned off, and read-port pass-gate transistor Q7 is turned on. The data are thus read into read bit line RBL.

With reference again to FIG. 1A, the write word line WWL[0] 112 is disposed a first distance 124 from an edge 110 of the array 100. The edge 110 extends horizontally (e.g., in the x-direction) and runs parallel to the write word lines WWL[0] and WWL[1], as illustrated in the figure. The write word line WWL[1] 114 is disposed a second distance 136 from the edge 110, with the second distance 136 being greater than the first distance 124. The read word lines RWL[0] and RWL[1] are both disposed a same third distance 128 from the edge 110 of the array, with the read word line RWL[0] being disposed entirely within a first column (i.e., a left column) of the array 100, and the read word line RWL[1] being disposed entirely within a second column (i.e., a right column) of the array 100. In examples, the read word lines RWL[0] and RWL[1] have a same width in the y-direction. It is noted that the read word lines RWL[0] and RWL[1] are not disposed above and below each other in the y-direction. Rather, the read word lines RWL[0] and RWL[1] are placed side-by-side, with both word lines being separated from the edge 110 by the same distance 128.

The read word lines RWL[0] and RWL[1] are placed side-by-side as shown in the figure (i.e., as opposed to being disposed above and below each other in the y-direction). This enables the write word lines WWL[0] and WWL[1] to have relatively large widths 116, 118. In other words, because the read word lines RWL[0] and RWL[1] are formed within a same strip extending in the x-direction, this enables the widths 116, 118 of the write word lines WWL[0] and WWL[1] to be increased. In the example of FIG. 1A, the write word lines WWL[0] and WWL[1] are conductive lines (e.g., metal lines), and these conductive lines have widths 116, 118 that are greater than the widths of the read word lines RWL[0] and RWL[1].

Increasing the widths 116, 118 of the write word lines WWL[0] and WWL[1] decreases the resistances of these word lines, which can improve performance of the SRAM cells 102, 104, 106, 108. Resistances and capacitances of the word lines 112, 114, 120, 122 can limit the performance of the SRAM cells, and the approaches of the instant disclosure provide structures and methods for lowering the resistances and/or capacitances of one or more of the word lines 112, 114, 120, 122. In the example of FIG. 1A, resistances of the word lines 112, 114 are decreased due to the larger widths 116, 118 of these word lines. Other embodiments described herein provide other structures and methods for lowering the resistances and/or capacitances of one or more of the word lines 112, 114, 120, 122.

FIG. 1B depicts another example array 150 of the SRAM cells 102, 104, 106, 108, in accordance with some embodiments. In the example of FIG. 1B, similar to FIG. 1A, the read word lines RWL[0] and RWL[1] are placed side-by-side, co-located within a same strip extending in the x-direction and disposed equal distances from the edge 110 of the array 150. As described above, this enables widths of the write word lines WWL[0] and WWL[1] to be increased. As shown in FIG. 1B, this further enables VSS lines 152, 154 (e.g., ground reference voltage lines) to be formed at cell boundaries. Specifically, because the read word lines RWL[0] and RWL[1] are formed within a same strip extending in the x-direction, there is sufficient space in the y-direction for forming the VSS lines 152, 154.

Figure 2:
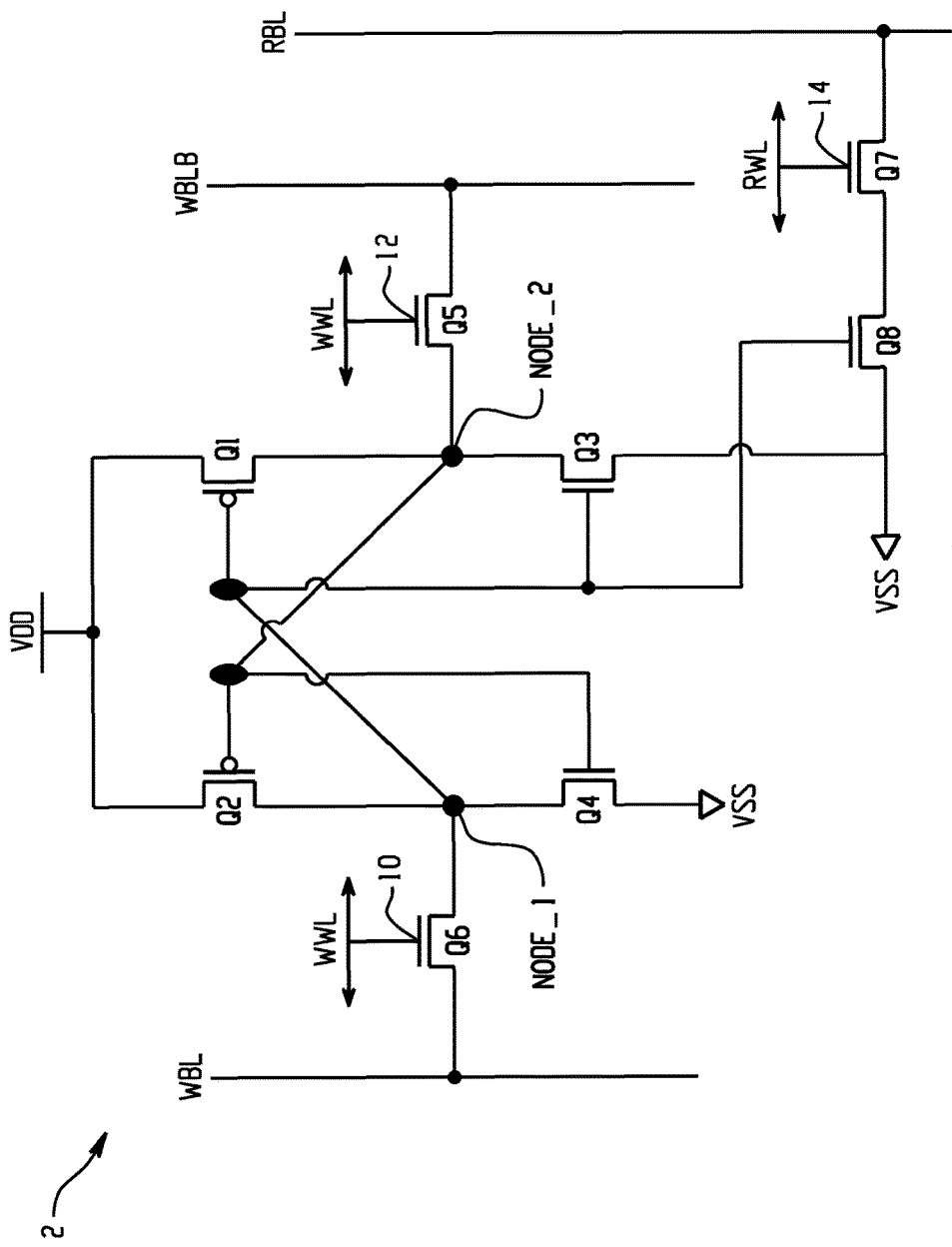
FIG. 2 is a schematic diagram of a two-port, eight-transistor (2P8T) SRAM cell, in accordance with some embodiments.

VSS line 152 connects to VSS nodes of the SRAM cells 102, 104, and the VSS line 154 connects to VSS nodes of the SRAM cells 106, 108. The connections of the VSS lines 152, 154 to such VSS nodes are described in further detail below with reference to FIGS. 4A-4C. The addition of the VSS lines 152, 154 to the array 150 may suppress undesirable "ground bounce" in the SRAM cells 102, 104, 106, 108. Ground bounce (also referred to as "ground-bouncing phase shift") degrades cell current in SRAM cells. In SRAM cells, VSS lines are grounded and electrically connected to the source terminals of pull-down transistors of the SRAM cells (e.g., pull-down transistors Q3 and Q4, as shown in FIG. 2). In examples, SRAM cells are formed on a substrate (e.g., a p-substrate) electrically connected to ground using substrate contacts distributed throughout the integrated circuit. Noise from switching on the ground supply line will appear first on the substrate and then, due to distributed resistance and capacitance, appear on the VSS line. This can result in a voltage difference between the source terminals of the pull-down transistors and the substrate. This difference in potential will cause the current characteristics of the SRAM cells to change whenever the substrate potential falls below the VSS line potential.

The undesirable effects of ground bounce described above may be mitigated or eliminated with the addition of the VSS lines 152, 154 to the array 150. Because the ground bounce can be suppressed, current characteristics of the SRAM cells 102, 104, 106, 108 are improved and better cell stability is realized. In the example of FIG. 1B, the VSS lines 152, 154 comprise conductive lines (e.g., metal lines). In examples, the VSS lines 152, 154 are formed within a same conductive layer as the word lines 112, 114, 120, 122. Thus, for instance, semiconductor layers of the SRAM cells 102, 104, 106, 108 are formed on a substrate, and the VSS lines 152, 154 and word lines 112, 114, 120, 122 are formed within a single conductive layer (e.g., an "M2" conductive layer) that overlays the semiconductor layers, in examples.

FIG. 1C depicts another example array 170 of the SRAM cells 102, 104, 106, 108, in accordance with some embodiments. In the example of FIG. 1C, like that of FIGS. 1A and 1B, read word lines RWL[0] and RWL[1] are placed side-by-side, co-located within a same strip extending in the x-direction and disposed equal distances from the edge 110 of the array 150. With read word lines RWL[0] and RWL[1] formed within the same strip extending in the x-direction, there is sufficient space for VSS islands 172A, 172B, 172C, 172D, 172E, 174A, 174B, 174C, 174D, 174E to be formed at cell boundaries, as shown in FIG. 1C. The VSS islands 172 connect to VSS nodes of the SRAM cells 106, 108, and the VSS islands 174 connect to VSS nodes of the SRAM cells 102, 104. The connections of the VSS islands 172, 174 to such VSS nodes are described in further detail below with reference to FIGS. 5A-5C.

The VSS islands 172, 174 may suppress ground bounce, similar to the VSS lines 152, 154 of FIG. 1B. Further, the use of the island structures, as opposed to continuous conductive lines, may reduce capacitances of the write word lines WWL[0] and WWL[1]. Specifically, a parallel plate capacitance exists between each of the islands 172, 174 and the respective write word lines WWL[0] and WWL[1], but these capacitances are less than the parallel plate capacitances that would result if continuous conductive lines were used for the VSS connections. As explained above with reference to FIG. 1A, capacitances of the word lines 112, 114, 120, 122 limit performance of the SRAM cells 102, 104, 106, 108, and so the use of the island structures 172, 174 to decrease the capacitances of the WWL[0] and WWL[1] can be advantageous. In examples, the VSS islands 172, 174 are formed within a same conductive layer as the word lines 112, 114, 120, 122.

The transistors of the SRAM cells 102, 104, 106, 108 of FIGS. 1A-1C may be formed in one or more active regions of a semiconductor substrate using various technologies. For example, the transistors of the SRAM cells may be formed as bulk planar metal oxide field effect transistors ("MOSFETs"), bulk finFETs having one or more fins or fingers, semiconductor on insulator ("SOT") planar MOSFETs, SOT finFETs having one or more fins or fingers, or combinations thereof. The gates of the devices may include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOT-Si"), silicon-on-insulator germanium ("SOI-Ge"), or combinations thereof.

In examples, the SRAM cells 102, 104, 106, 108 of FIGS. 1A-1C include semiconductor layers forming the above-noted transistors on the substrate. A plurality of conductive layers, referred to herein as conductive layers M1-M4, are formed above the semiconductor layers in a vertical or z-direction. In embodiments, each of the conductive layers M1-M4 comprises a respective metal layer. Each conductive layer M1-M4 defines a plane in the x- and y-directions and may be separated from each other and from the substrate by one or more dielectric layers. In some embodiments, vias extend in the vertical direction to provide connections between conductive layers M1-M4 and the substrate. To illustrate the various layers used in forming the SRAM cells 102, 104, 106, 108, reference is made to FIGS. 3A-3D.

Figure 3A:
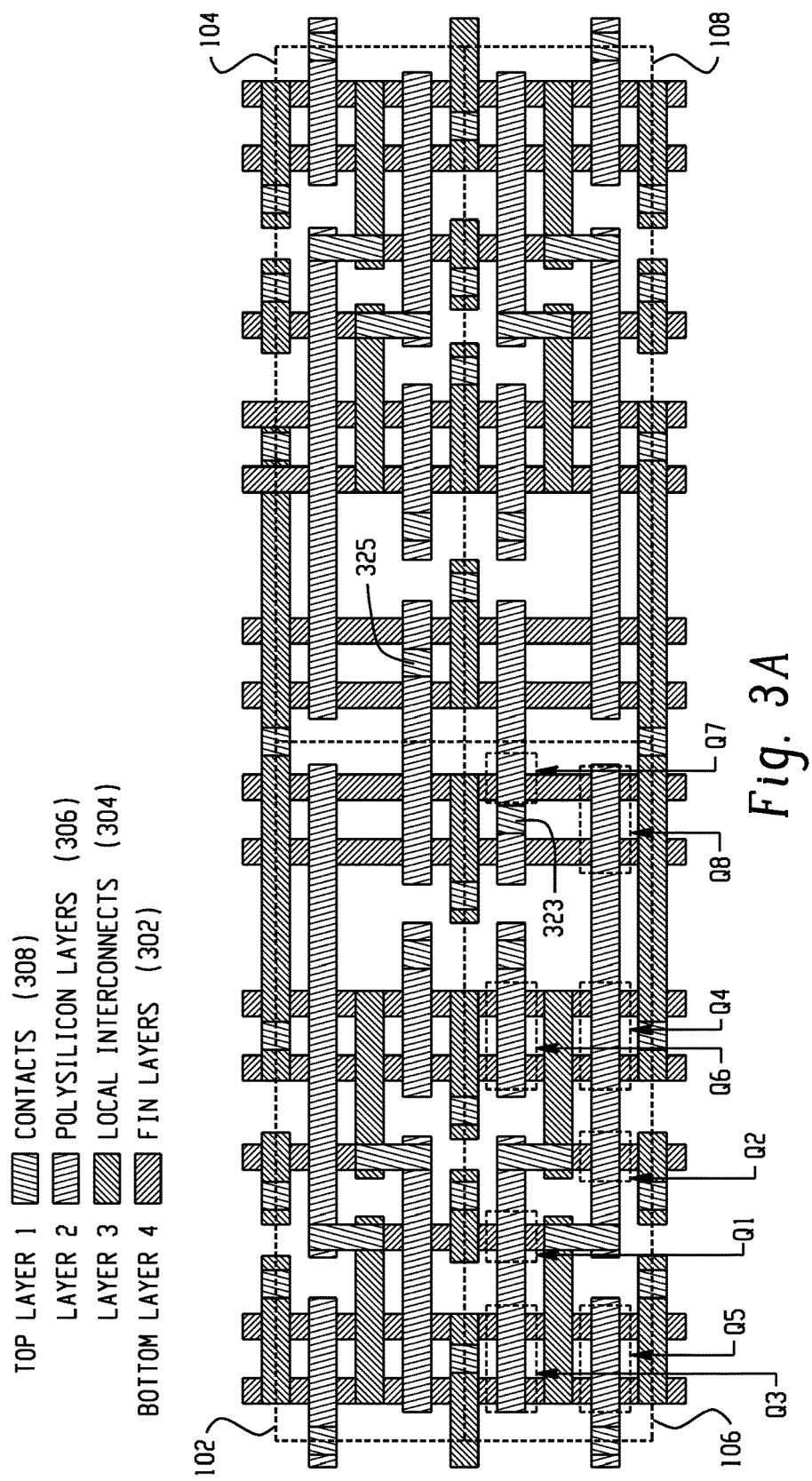
FIG. 3A depicts semiconductor layers of the 2P8T SRAM cell of FIG. 2, in accordance with some embodiments.

FIG. 3A depicts semiconductor layers comprising portions of the two-port SRAM cells 102, 104, 106, 108, in accordance with some embodiments. In the example of FIG. 3A, each of the cells 102, 104, 106, 108 includes eight transistors Q1-Q8 formed via fin layers 302 and polysilicon layers 306 disposed over a substrate. The transistors Q1-Q8 are illustrated in cell 106 of FIG. 3A, and cells 102, 104, 108 include similar transistors. Specifically, sources and drains of the transistors Q1-Q8 are formed in the fin layers 302 that extend in the y-direction, and gate structures of the transistors include the polysilicon layers 306 extending in the x-direction. Local interconnects 304 comprise conductive structures that connect the transistors Q1-Q8 in the manner shown in the circuit diagram of FIG. 2. Various contacts to the transistors are formed using contacts 308. The contacts 308 comprise conductive material (e.g., metal, etc.), in embodiments.

Figure 3B:
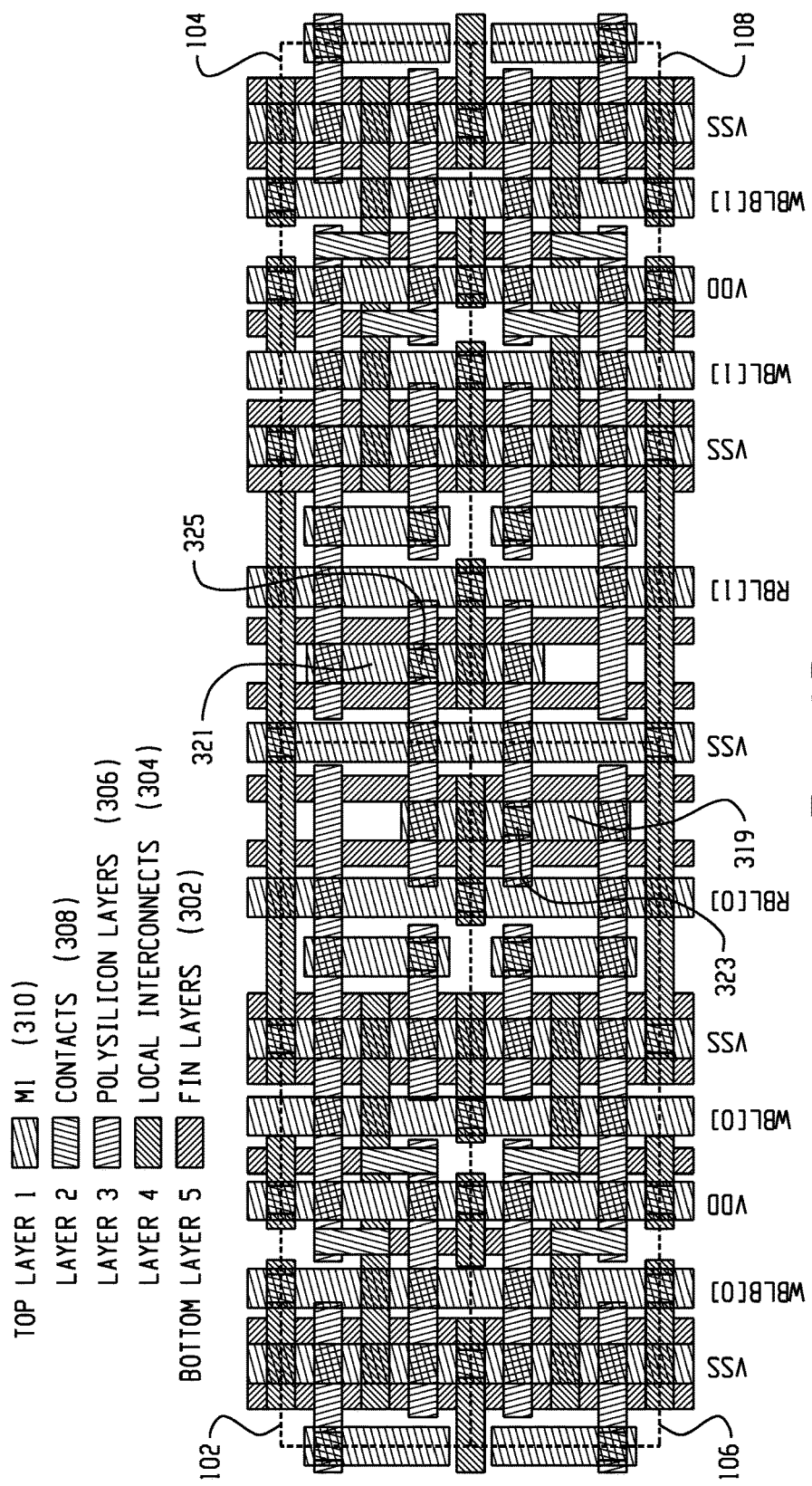
FIG. 3B depicts conductive layer M1 that is formed over the semiconductor layers depicted in FIG. 3A, in accordance with some embodiments.

FIG. 3B depicts conductive layer M1 310 that is formed over the semiconductor layers depicted in FIG. 3A, in accordance with some embodiments. As shown in FIG. 3B, VSS, VDD, WBLB[0], WBLB[1], WBL[0], WBL[1], RBL[0], and RBL[1] lines of the SRAM cells 102, 104, 106, 108 are formed in the conductive layer M1 310. These structures comprise conductive lines that (i) extend in the y-direction, and (ii) form electrical connections to contacts 308 of the underlying layer.

Figure 3C:
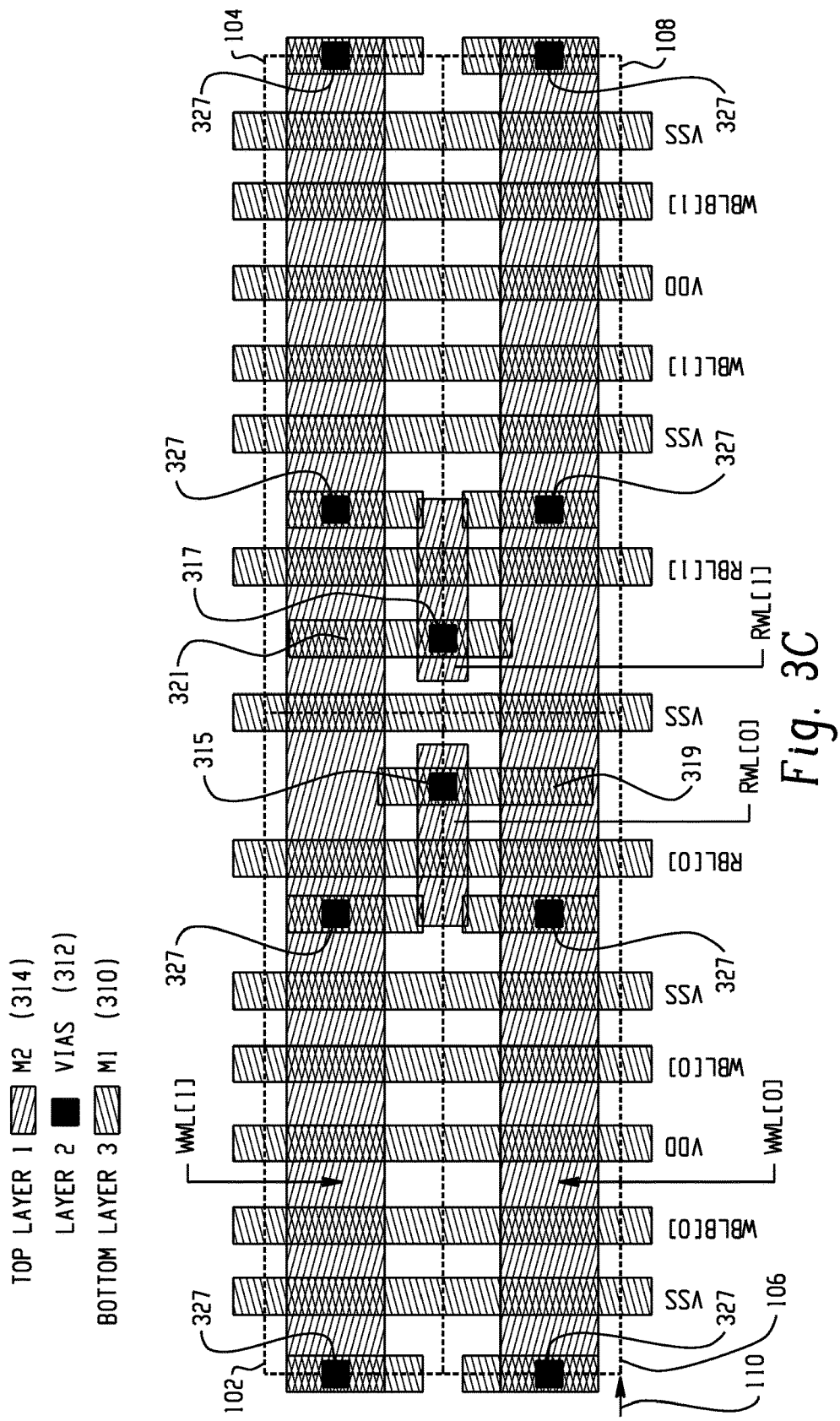
FIG. 3C depicts conductive layer M2 formed over the conductive layer M1 depicted in FIG. 3B, in accordance with some embodiments.

FIG. 3C depicts conductive layer M2 314 formed over the conductive layer M1 310 depicted in FIG. 3B, in accordance with some embodiments. As shown in FIG. 3C, WWL[0], WWL[1], RWL[0], and RWL[1] lines of the SRAM cells 102, 104, 106, 108 are formed in the conductive layer M2 314. The WWL[0] and WWL[1] structures comprise conductive lines that extend in the x-direction, and the RWL[0] and RWL[1] structures comprise conductive islands that extend in the x-direction. Vias 312 are used to connect portions of the conductive layer M2 to portions of the underlying conductive layer M1.

The read word line RWL[0] is operable to control access to the SRAM cells 106, 108 for read operations. Specifically, a via 315 connects the RWL[0] to an underlying conductive line 319 formed in the first conductive layer M1, and the underlying conductive line 319 is connected to a gate contact 323 of the Q7 transistors formed in the cells 106, 108. This gate contact 323 is depicted in FIGS. 3A and 3B. The Q7 transistors are read-port pass-gate transistors, which are turned off when write operations are performed and turned on when read operations are performed, as described above with reference to FIG. 2. Similarly, a via 317 connects the RWL[1] to an underlying conductive line 321 formed in the first conductive layer M1, and the underlying conductive line 321 is connected to a gate contact 325 of transistors Q7 formed in the cells 102, 104. This gate contact 325 is depicted in FIGS. 3A and 3B.

The write word lines WWL[0] and WWL[1] are connected to the first conductive layer M1 using the vias 327. With the connections made as depicted in FIGS. 3A-3B, the write word line WWL[0] is operable to control access to the SRAM cells 106, 108 formed in the lower row of the array for write operations, and the write word line WWL[1] is operable to control access to the SRAM cells 102, 104 formed in the upper row of the array for write operations.

As shown in FIG. 3C, the read word lines RWL[0] and RWL[1] are both disposed a same distance from the edge 110 of the array and have a same width in the y-direction. Because the read word lines RWL[0] and RWL[1] are disposed side-by-side, co-located within a same strip extending in the x-direction (i.e., as opposed to being disposed above and below each other in the y-direction), this allows the write word lines WWL[0] and WWL[1] to have relatively large widths, as described above. The relatively large widths of the WWL[0] and WWL[1] decrease the resistances of these word lines, which can improve performance of the SRAM cells 102, 104, 106, 108.

Figure 3D:
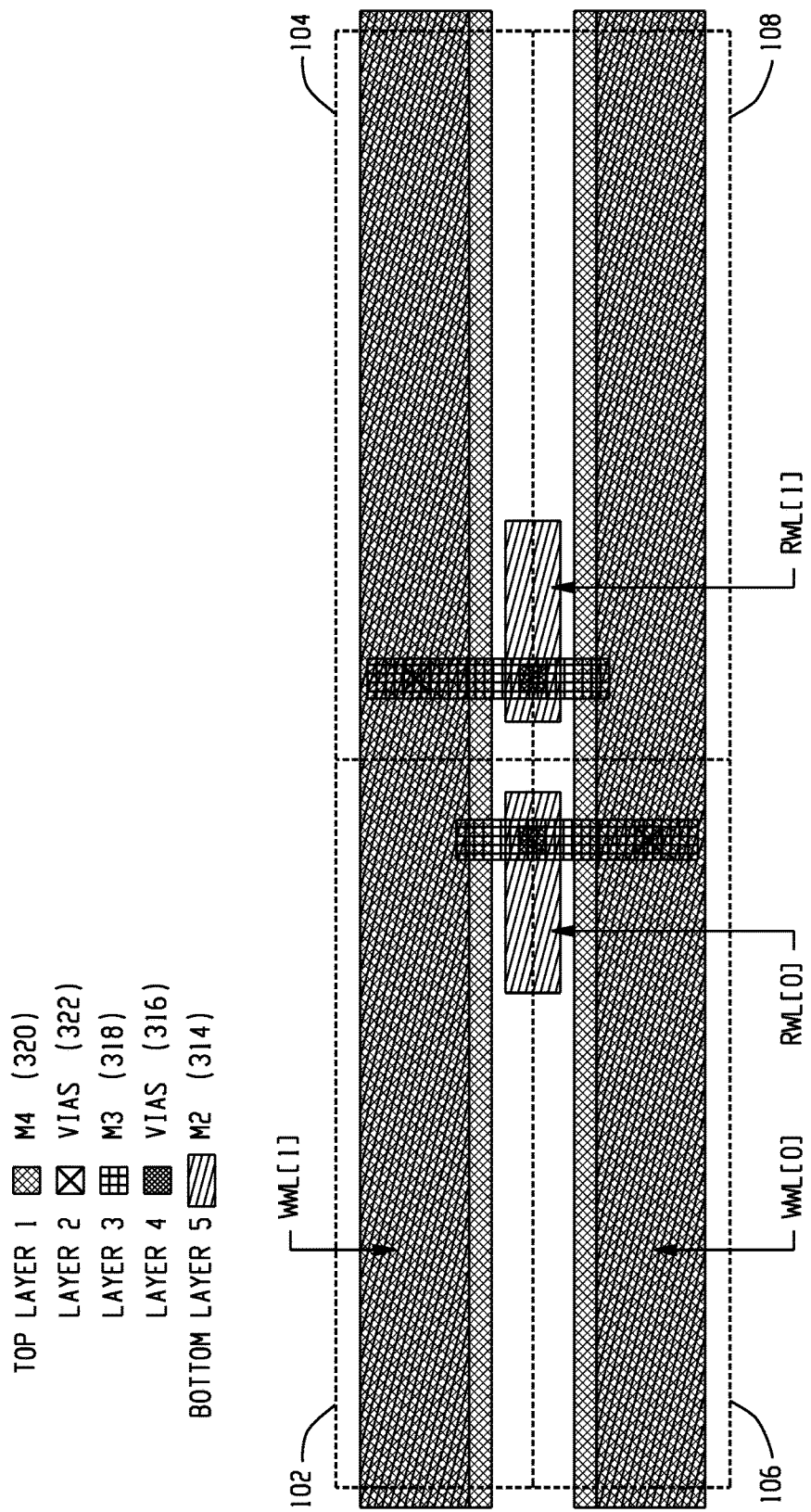
FIG. 3D depicts conductive layers M3 and M4 formed over the conductive layer M2 depicted in FIG. 3C, in accordance with some embodiments.

FIG. 3D depicts conductive layers M3 318 and M4 320 formed over the conductive layer M2 314 depicted in FIG. 3C, in accordance with some embodiments. Specifically, the conductive layer M3 318 is formed over the conductive layer M2 314 of FIG. 3C, and the conductive layer M4 320 is formed over the conductive layer M3 318. Vias 316 are used to connect portions of the conductive layer M3 318 to portions of the underlying conductive layer M2 314. Likewise, vias 322 are used to connect portions of the conductive layer M4 320 to portions of the underlying conductive layer M3 318. The combined collection of layers shown FIGS. 3A-3D includes semiconductor structures and conductive structures for forming an array of 2P8T SRAM cells. It is noted that the particular layout of FIGS. 3A-3D is merely an example, and that an array of 2P8T SRAM cells may be formed in various other ways according to the approaches of this disclosure.

Figure 4A:
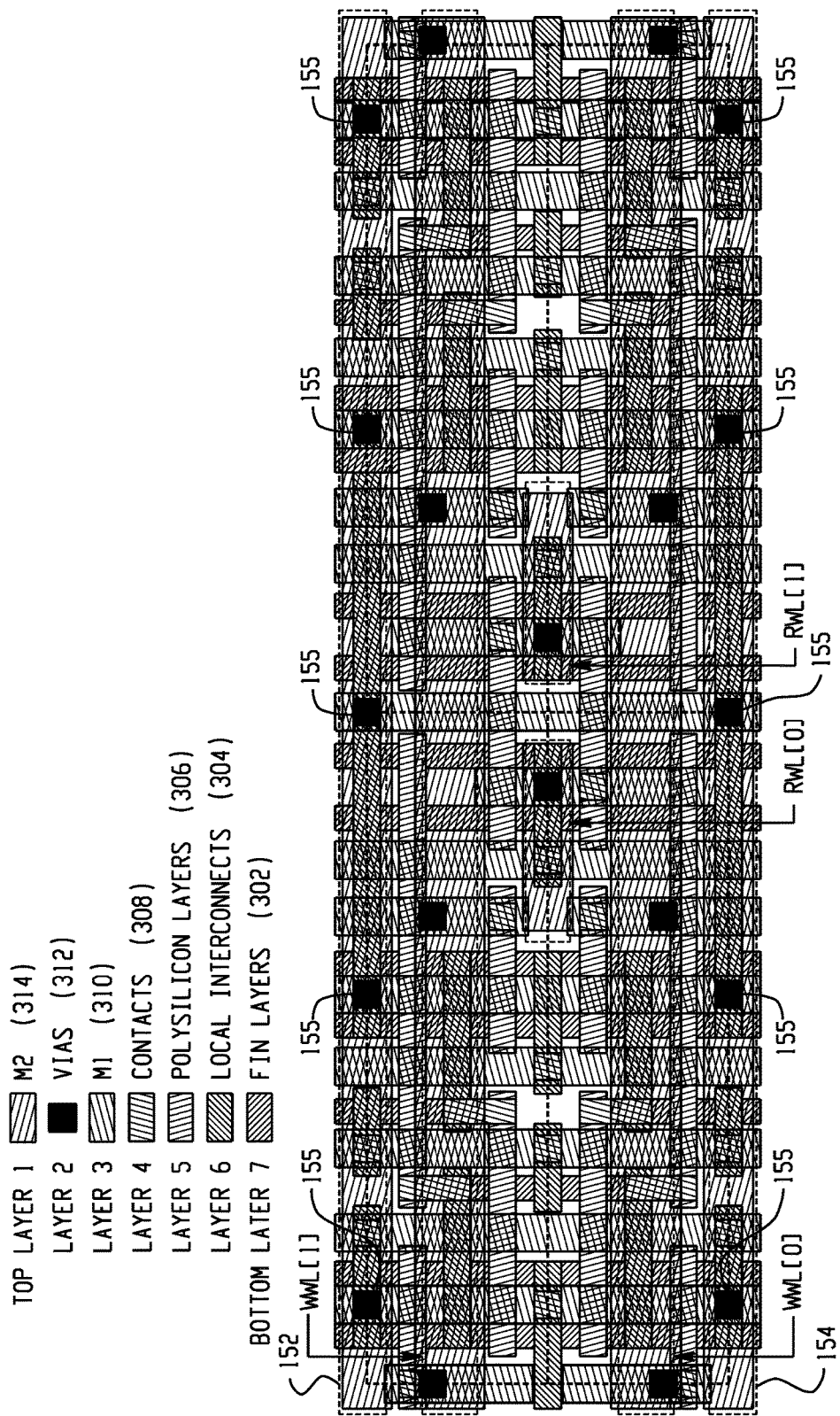
FIG. 4A depicts an example array of SRAM cells having VSS lines formed at cell boundaries, in accordance with some embodiments.

FIG. 4A depicts an example array of SRAM cells having VSS lines formed at cell boundaries, in accordance with some embodiments. The array of SRAM cells shown in FIG. 4A includes (i) the fin layers 302, local interconnects 304, polysilicon structures 306, and contacts 308 of FIG. 3A, and (ii) the conductive layer M1 310 of FIG. 3B. In addition to these layers, the array of FIG. 4A further includes VSS lines 152, 154 formed in the conductive layer M2 314 at boundaries of the cell. The VSS lines of the underlying conductive layer M1 310 are shown in FIG. 3B.

Figure 4B:
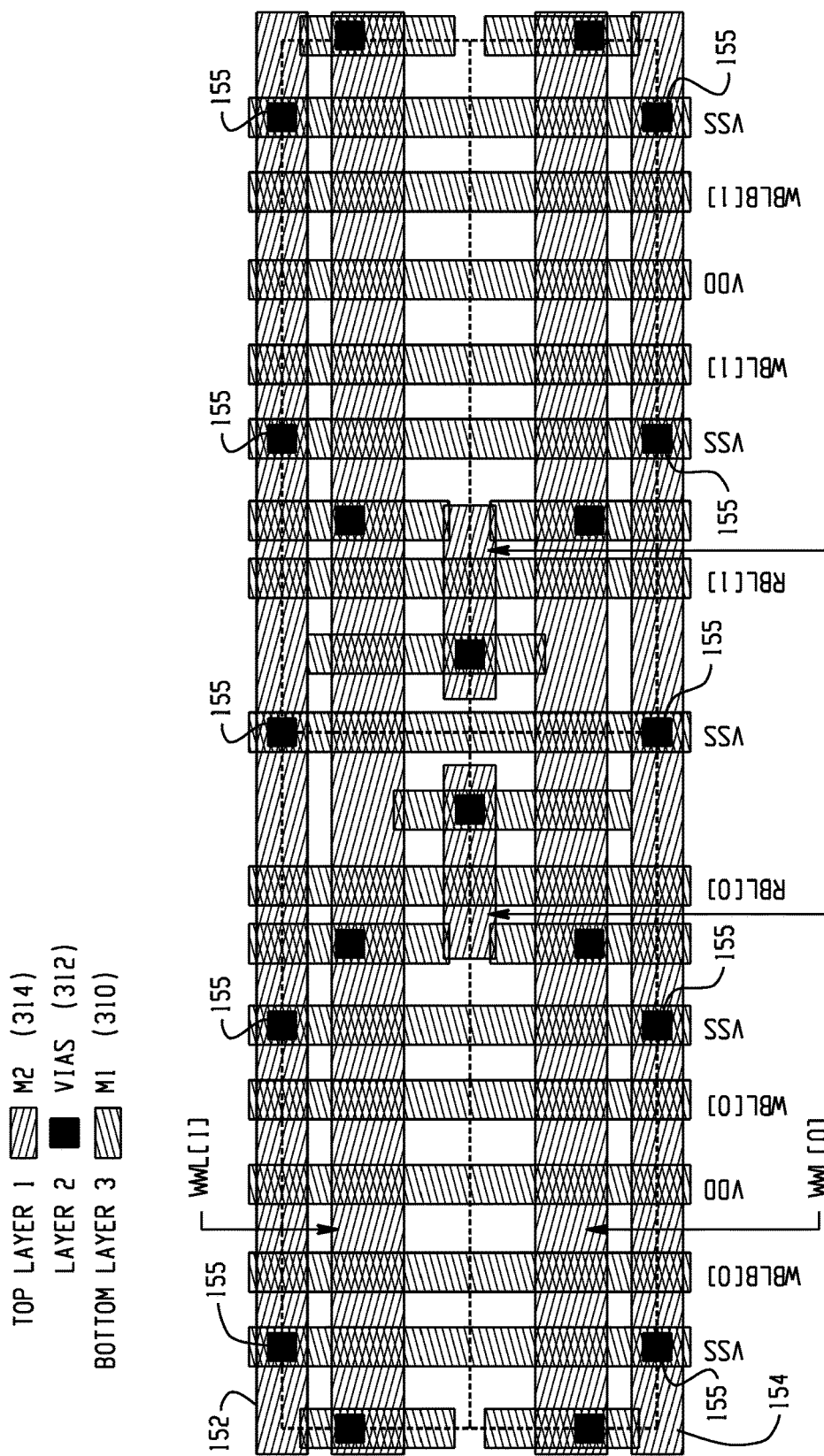
FIGS. 4B-4C depict layers of the example array of SRAM cells of FIG. 4A, in accordance with some embodiments.

To further illustrate the VSS lines 152, 154 formed in the conductive layer M2 314 and the vias 155, reference is made to FIG. 4B. This figure depicts conductive layer M2 314 formed over the conductive layer M1 310 depicted in FIG. 3B, in accordance with some embodiments. The VSS lines 152, 154 connect to VSS lines formed in the underlying conductive layer M1 310 using vias 155, as shown in the figure. The embodiment of FIG. 4B includes features formed in the conductive layer M2 314 that are the same as or similar to those shown in FIG. 3C (e.g., WWL[0], WWL[1], RWL[0], RWL[1]) and also includes the aforementioned VSS lines 152, 154 and vias 155.

Figure 4C:
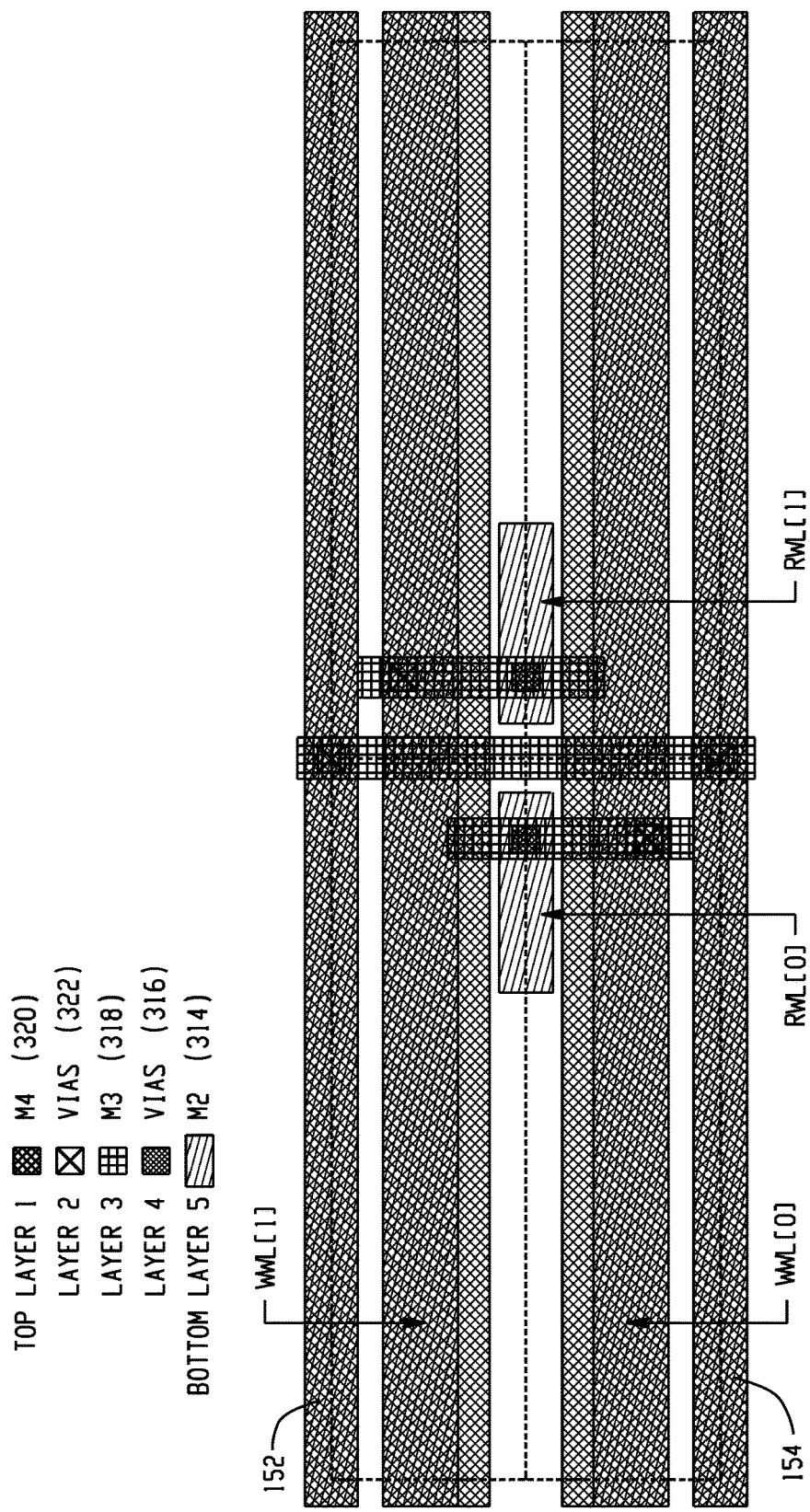

FIG. 4C depicts conductive layers M3 318 and M4 320 formed over the conductive layer M2 314 depicted in FIG. 4B, in accordance with some embodiments. Specifically, the conductive layer M3 318 is formed over the conductive layer M2 314 of FIG. 4B, and the conductive layer M4 320 is formed over the conductive layer M3 318. When combined, the collection of layers of FIGS. 3A, 3B, 4B, and 4C form the layout shown in FIG. 4A.

As described above with reference to FIG. 1B, because the read word lines RWL[0] and RWL[1] are formed within a same strip extending in the x-direction, there is sufficient space in the y-direction for forming the VSS lines 152, 154. The addition of the VSS lines 152, 154 to the array may suppress undesirable "ground bounce" in the SRAM cells, as described above. In suppressing the ground bounce, current characteristics of the SRAM cells are improved and better cell stability is realized. In the example of FIGS. 4A-4C, the VSS lines 152, 154 comprise conductive lines formed within the same conductive layer (e.g., the conductive layer M2 314 or another conductive layer) in which the write word lines and read word lines are formed.

Figure 5A:
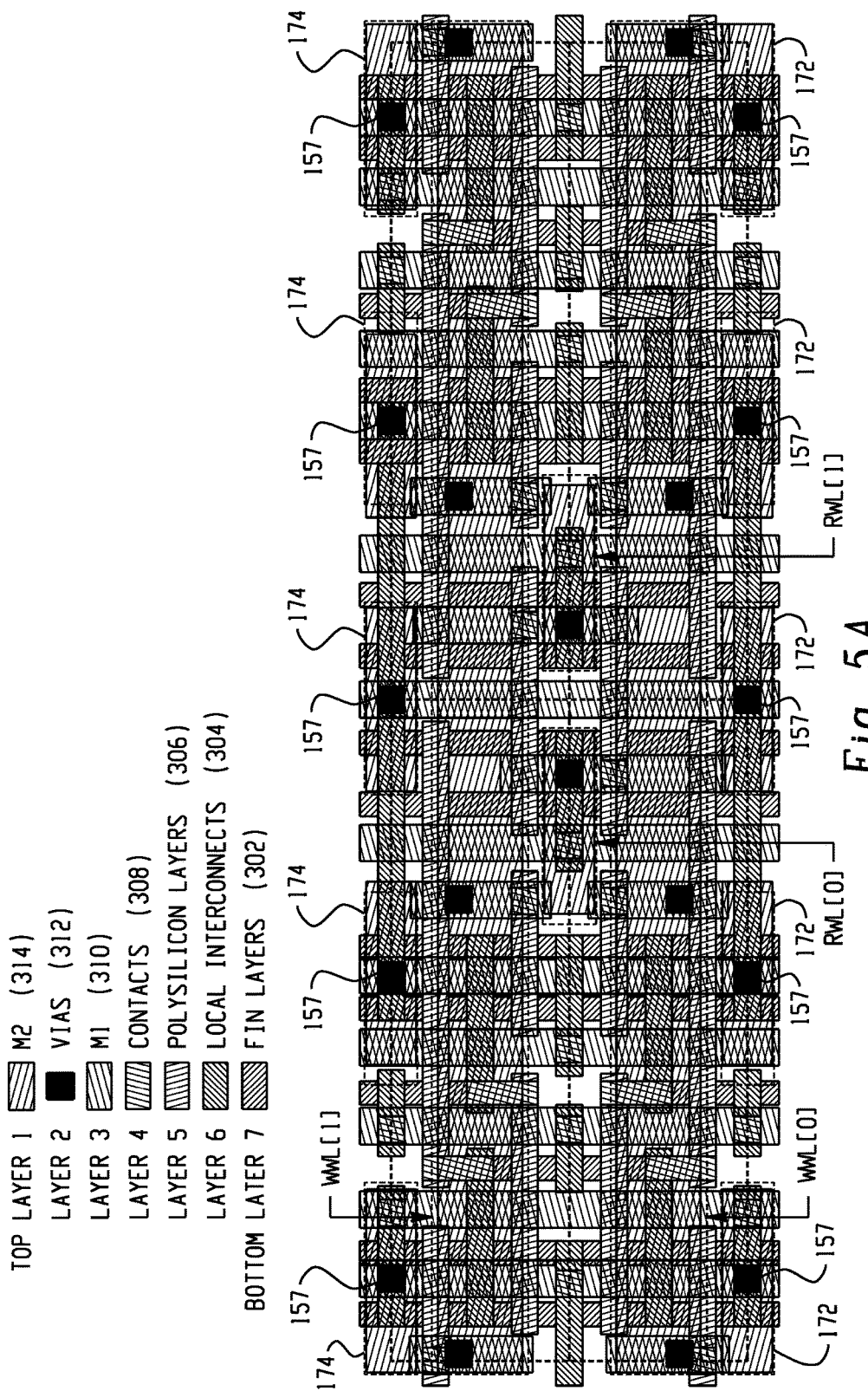
FIG. 5A depicts an example array of SRAM cells having VSS islands formed at cell boundaries, in accordance with some embodiments.

FIG. 5A depicts an example array of SRAM cells having VSS islands formed at cell boundaries, in accordance with some embodiments. The array of SRAM cells shown in FIG. 5A includes (i) the fin layers 302, local interconnects 304, polysilicon structures 306, and contacts 308 of FIG. 3A, and (ii) the conductive layer M1 310 of FIG. 3B. In addition to these layers, the array of FIG. 5A further includes VSS islands 172, 174 formed in the conductive layer M2 314 at boundaries of the cell. The VSS islands 172, 174 connect to VSS lines formed in the underlying conductive layer M1 310 using vias 157. The VSS lines of the underlying conductive layer M1 310 are shown in FIG. 3B.

Figure 5B:
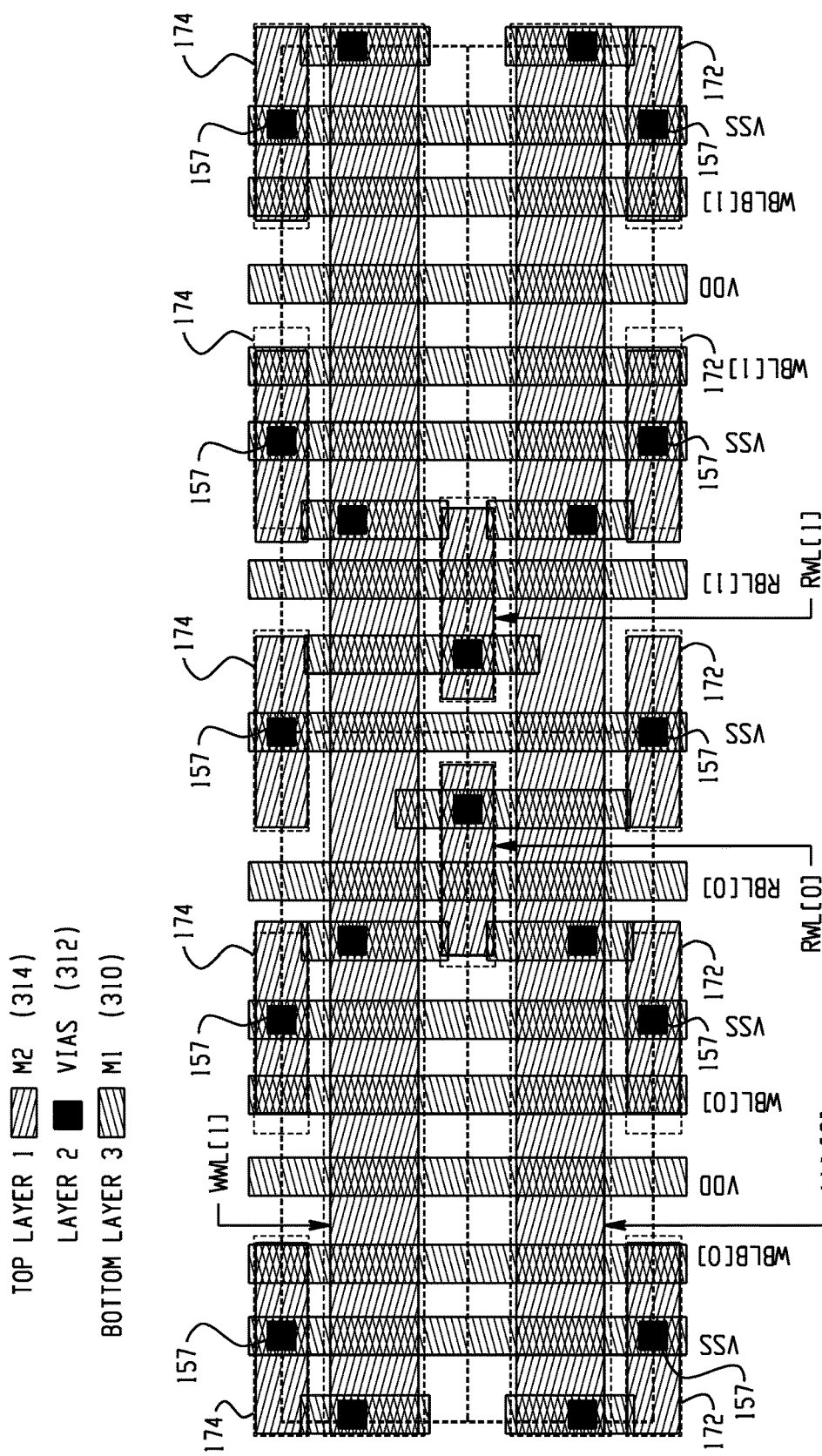
FIGS. 5B-5C depict layers of the example array of SRAM cells of FIG. 5A, in accordance with some embodiments.

To further illustrate the VSS islands 172, 174 formed in the conductive layer M2 314 and the vias 157, reference is made to FIG. 5B. This figure depicts conductive layer M2 314 formed over the conductive layer M1 310 depicted in FIG. 3B, in accordance with some embodiments. The embodiment of FIG. 5B includes features formed in the conductive layer M2 314 that are the same as or similar to those shown in FIG. 3C (e.g., WWL[0], WWL[1], RWL[0], RWL[1]) and also includes the aforementioned VSS islands 172, 174 and vias 157.

Figure 5C:
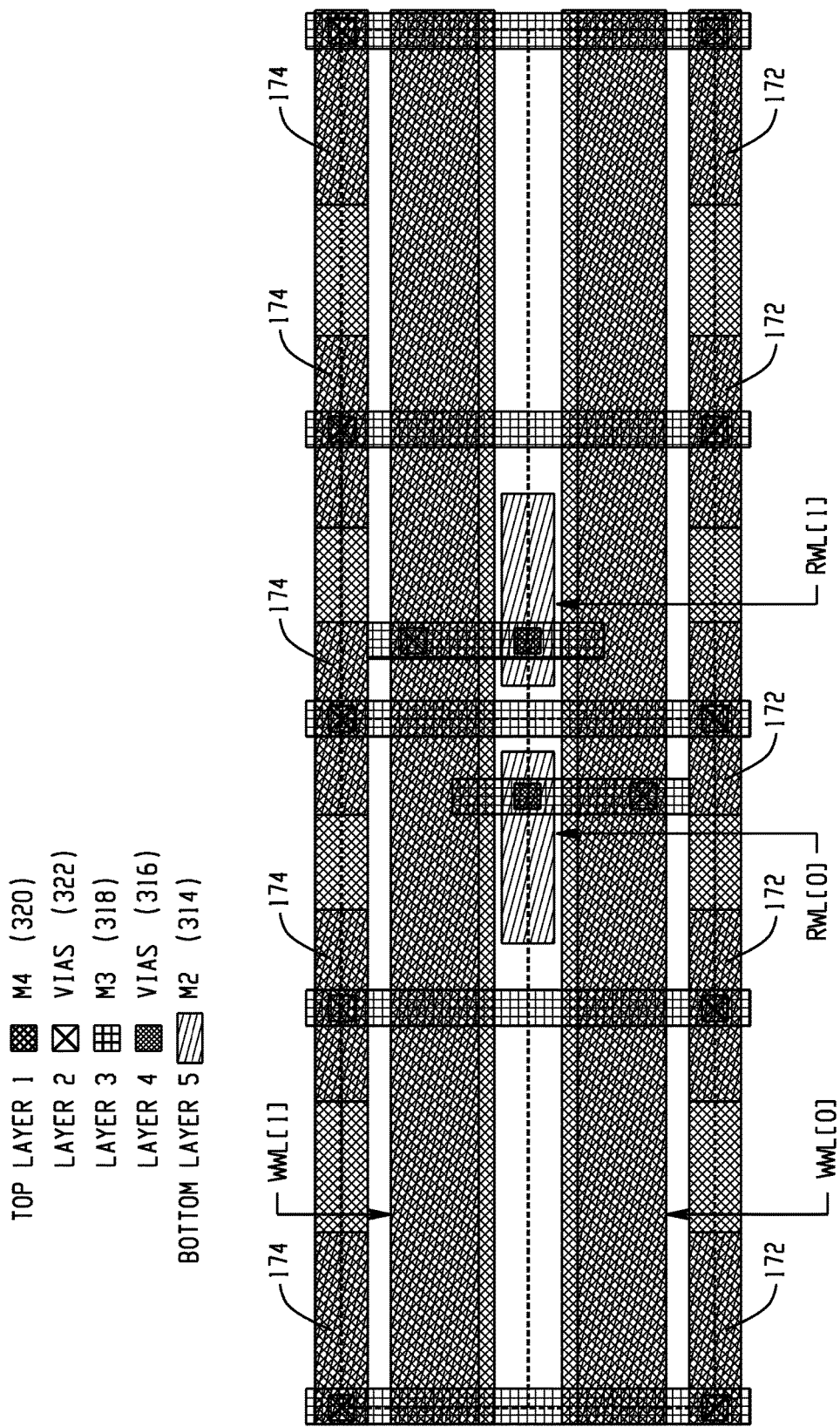

FIG. 5C depicts conductive layers M3 318 and M4 320 formed over the conductive layer M2 314 depicted in FIG. 5B, in accordance with some embodiments. Specifically, the conductive layer M3 318 is formed over the conductive layer M2 314 of FIG. 5B, and the conductive layer M4 320 is formed over the conductive layer M3 318. When combined, the collection of layers of FIGS. 3A, 3B, 5B, and 5C form the layout shown in FIG. 5A.

The VSS islands 172, 174 may suppress ground bounce, similar to the VSS lines 152, 154 of FIG. 4A. Further, the use of the island structures, as opposed to continuous conductive lines, may reduce capacitance of the write word lines WWL[0] and WWL[1], as described above with reference to FIG. 1C. In the example of FIGS. 5A-5C, the VSS islands 172, 174 comprise conductive structures formed within the same conductive layer (i.e., the conductive layer M2 314) in which the write word lines and read word lines are formed.

FIG. 6A-6D depict another example array of SRAM cells, in accordance with some embodiments. The array of SRAM cells shown in FIG. 6A includes the fin layers 302, local interconnects 304, polysilicon structures 306, and contacts 308 of FIG. 3A. Formed over these structures is a conductive layer M1 610, as shown in the figure. The conductive structures of the conductive layer M1 610 are similar to those of the conductive layer M1 310 shown in FIG. 3B and form VDD, WBLB, WBL, and RBL lines of the SRAM cells.

Figure 6A:
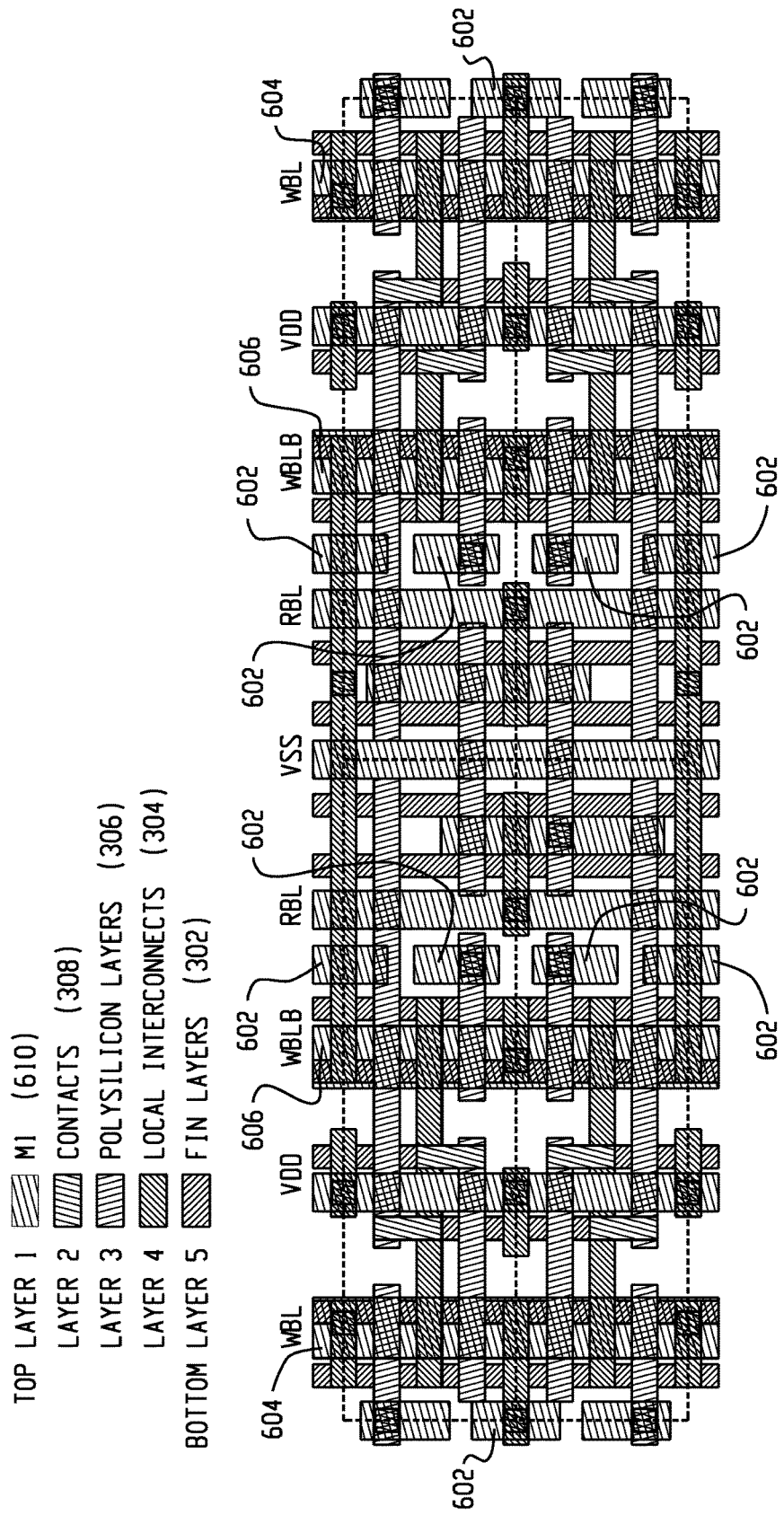
FIGS. 6A-6D depict another example array of SRAM cells, in accordance with some embodiments.

However, the conductive layer M1 610 of FIG. 6A differs from the conductive layer 310 of FIG. 3B in several respects. First, rather than using continuous conductive lines to form VSS lines (e.g., as are used in the example of FIG. 3B), in FIG. 6A, VSS islands 602 are formed in the conductive layer M1 610. Second, because continuous conductive lines are not used to form the VSS lines, this leaves more space for the WBL and WBLB lines 604, 606. Accordingly, the WBL and WBLB lines 604, 606 formed in the conductive layer M1 610 of FIG. 6A are wider than those formed in the conductive layer 310 of FIG. 3B. The wider WBL and WBLB lines 604, 606 of FIG. 6A have a lower resistance than their counterparts in FIG. 3B, and the lower resistance may improve performance of the SRAM cells. It is further noted that the use of the VSS islands 602, as opposed to continuous VSS lines, may reduce capacitances of the WBL and WBLB lines 604, 606. Specifically, a parallel plate capacitance exists between each of the islands 602 and the closest WBL line 604 or WBLB line 606, but these capacitances are less than the parallel plate capacitances that would result if continuous conductive lines were used for the VSS lines. Capacitances of bit lines limit performance of SRAM cells, and so the use of the VSS islands to decrease the capacitances of the WBL and WBLB lines 604, 606 is advantageous.

Figure 6B:
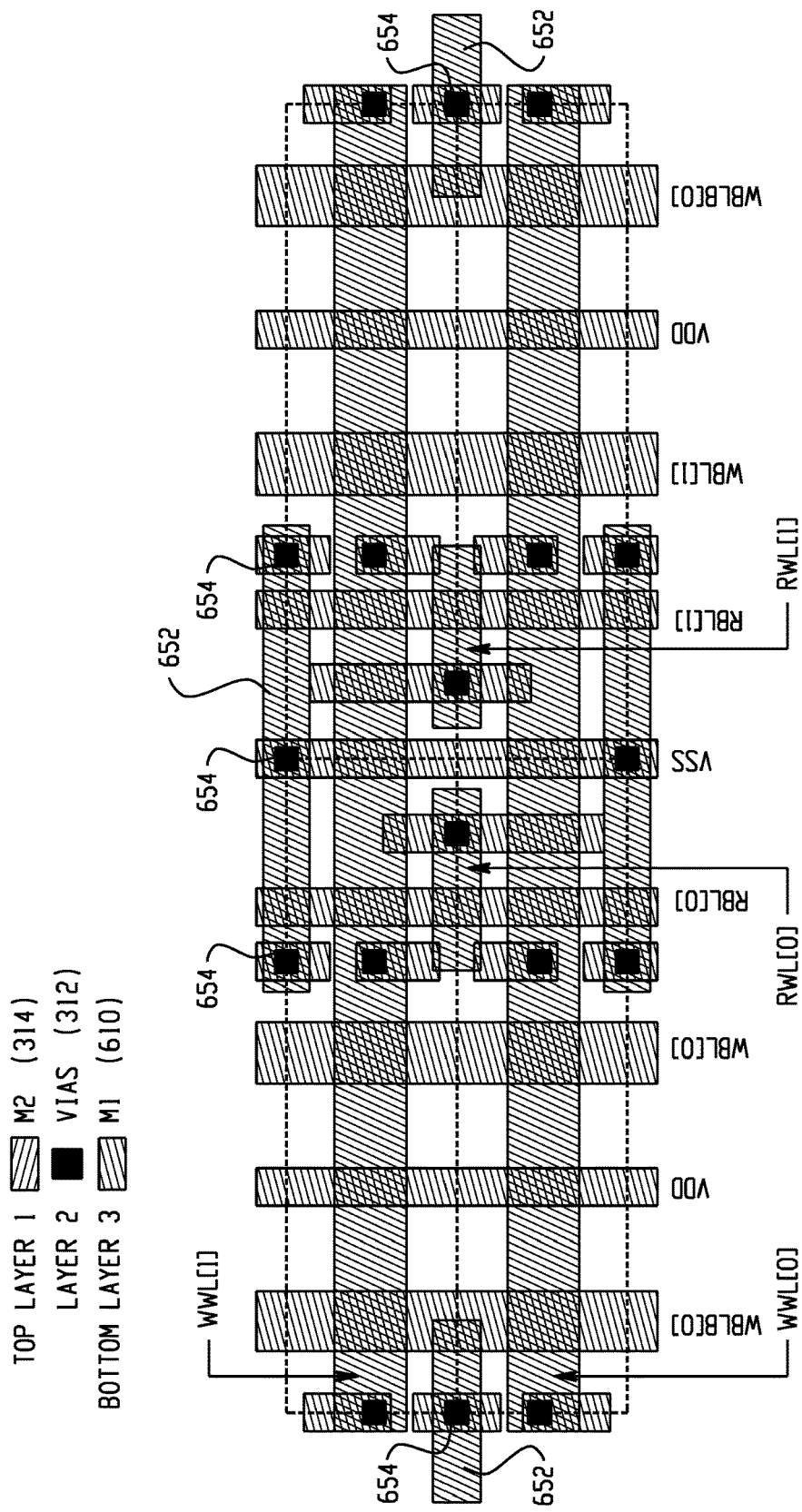

FIG. 6B depicts conductive layer M2 314 formed over the conductive layer M1 610 depicted in FIG. 6A. As shown in FIG. 6B, VSS lines 652 are formed in the conductive layer M2 314. The VSS lines 652 include VSS lines formed at top and bottom boundaries of the array and VSS lines formed at the left-most and right-most edges of the array, as illustrated in the figure. The VSS lines 652 connect to VSS islands 602 formed in the underlying conductive layer M1 610 using vias 654. The VSS islands 602 of the underlying conductive layer M1 610 are shown in FIG. 6A. The embodiment of FIG. 6B includes features formed in the conductive layer M2 314 that are the same as or similar to those shown in FIG. 3C (e.g., WWL[0], WWL[1], RWL[0], RWL[1]) and also includes the aforementioned VSS lines 652 and vias 654.

Figure 6C:
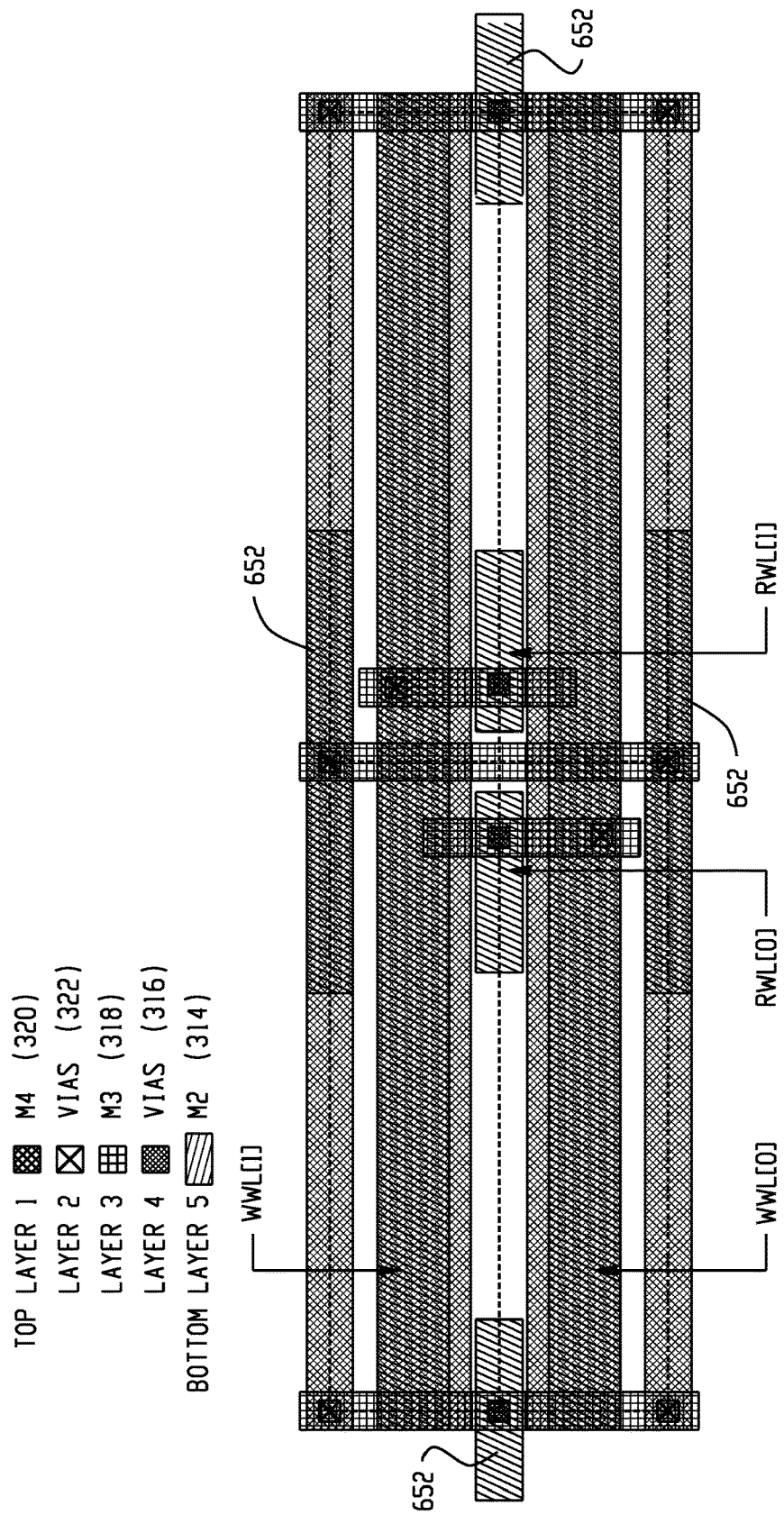
Figure 6D:
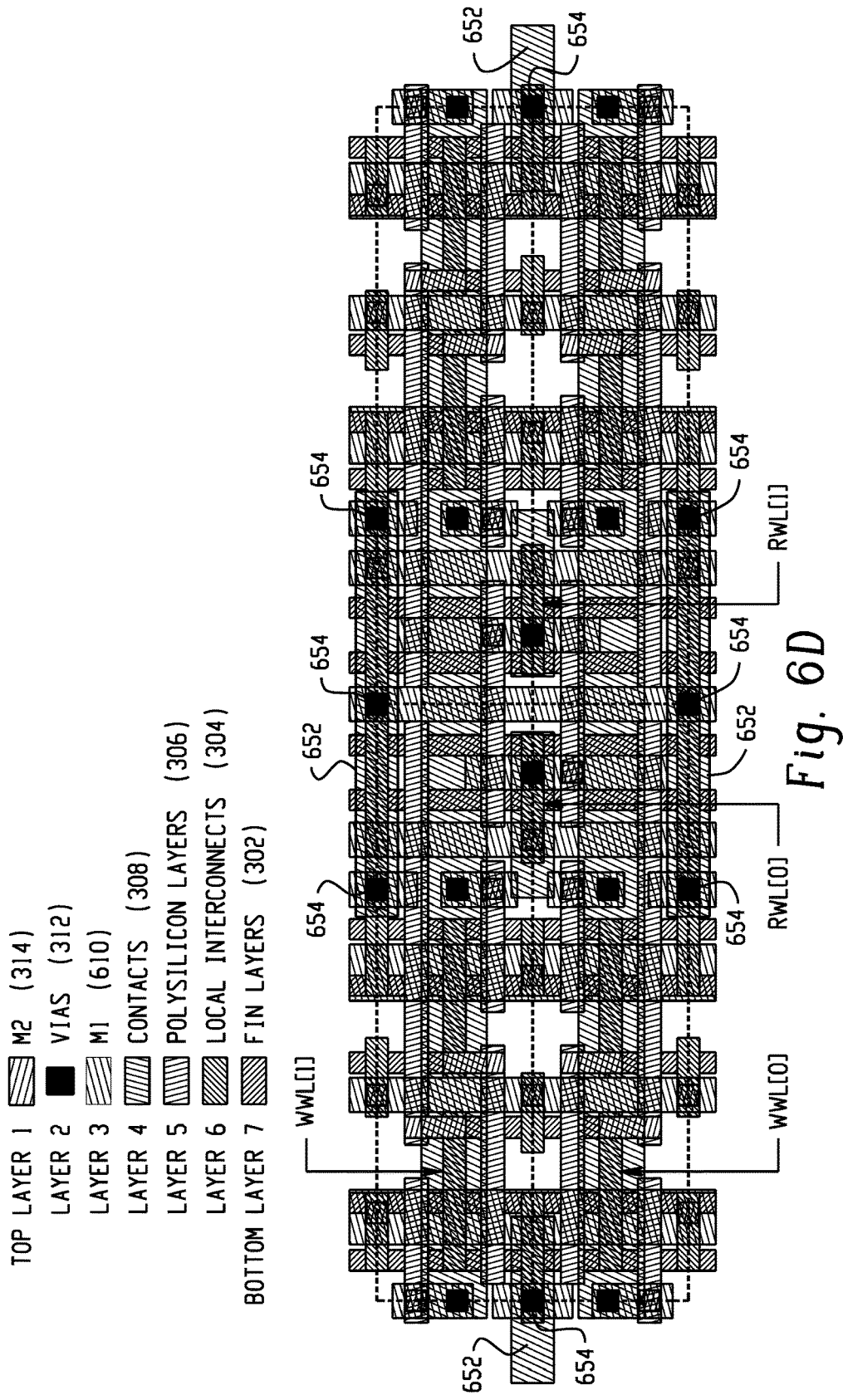

FIG. 6C depicts conductive layers M3 318 and M4 320 formed over the conductive layer M2 314 depicted in FIG. 6B, in accordance with some embodiments. Specifically, the conductive layer M3 318 is formed over the conductive layer M2 314 of FIG. 6B, and the conductive layer M4 320 is formed over the conductive layer M3 318. When combined, the collection of layers of FIGS. 3A, 6A, and 6B form the layout shown in FIG. 6D. As seen in FIG. 6D, the layout includes the above-described VSS lines 652 formed in the conductive layer M2 314 and the vias 654.

The use of the VSS lines 652 having lengths that do not extend across the entire width of the 2×2 array may reduce capacitances of the write word lines WWL[0] and WWL[1], as described above with reference to FIG. 1C. In the example of FIGS. 6A-6D, the VSS lines 652 comprise conductive structures formed within the same conductive layer (i.e., the conductive layer M2 314) in which the write word lines and read word lines are formed.

Figure 7:
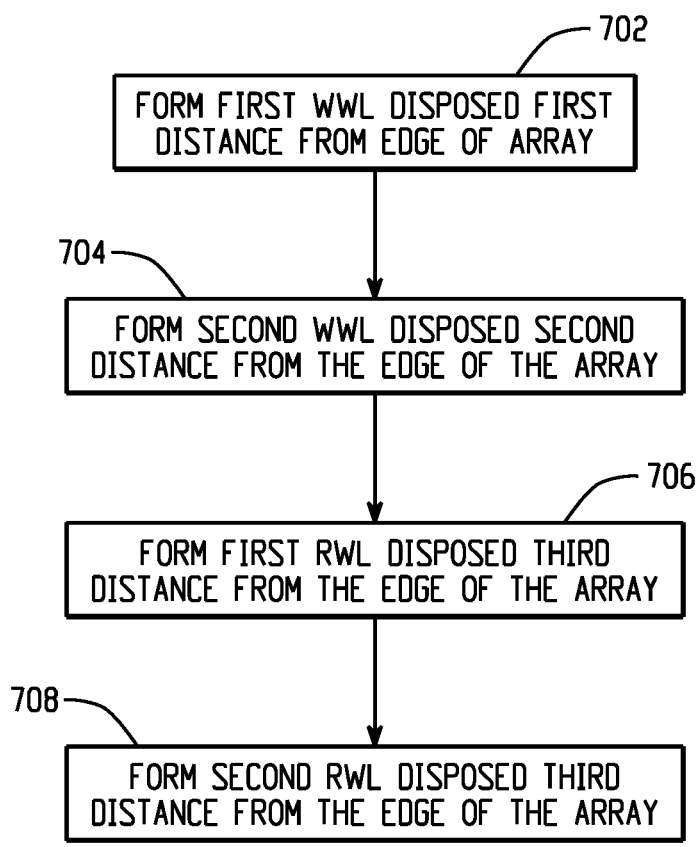
FIG. 7 is a flowchart depicting steps of an example for fabricating an array of SRAM cells, in accordance with some embodiments.

FIG. 7 is a flowchart depicting steps of an example for fabricating an array of SRAM cells, in accordance with some embodiments. FIG. 7 is described with reference to FIG. 1A above for ease of understanding. But the process of FIG. 7 is applicable to other structures as well. At 702, a first write word line (WWL) (e.g., write word line WWL[0] 112) that is disposed a first distance from an edge of the array (e.g., a distance 124 from an edge 110 of an array 100) is formed. The first WWL is operable to control access to SRAM cells of a first row of the array (e.g., SRAM cells 106, 108) for write operations. At 704, a second WWL (e.g., write word line WWL[1] 114) that is disposed a second distance (e.g., distance 136) from the edge of the array is formed. The second WWL is operable to control access to SRAM cells of a second row of the array (e.g., SRAM cells 102, 104) for write operations. At 706, a first read word line (RWL) (e.g., read word line RWL[0] 120) that is disposed a third distance (e.g., distance 128) from the edge of the array is formed, where the first RWL is operable to control access to the SRAM cells of the first row for read operations. At 708, a second RWL (e.g., read word line RWL[1] 122) that is disposed the third distance from the edge of the array is formed, where the second RWL is operable to control access to the SRAM cells of the second row for read operations. It is noted that in embodiments, some of the steps 702-708 of FIG. 7 are performed simultaneously and not necessarily sequentially, and that in embodiments, the ordering of the steps 702-708 varies from that depicted in the figure.

The present disclosure in various embodiments is directed to arrays of static random access memory (SRAM) cells and methods of fabricating the same. An example array of SRAM cells arranged in rows and columns includes a first communication path disposed a first distance from an edge of the array and operable to control access to SRAM cells of a first row of the array for write operations. The array also includes a second communication path disposed a second distance from the edge of the array and operable to control access to SRAM cells of a second row of the array for write operations. The second distance is different than the first distance. A first conductive structure is disposed a third distance from the edge of the array and is operable to control access to the SRAM cells of the first row for read operations. A second conductive structure is disposed the third distance from the edge of the array and is operable to control access to the SRAM cells of the second row for read operations.

In another example, an array of SRAM cells arranged in rows and columns includes a first communication path operable to control access to SRAM cells of a first row of the array for write operations. A second communication path is operable to control access to SRAM cells of a second row of the array for write operations. A first conductive structure is disposed a distance from an edge of the array and is operable to control access to the SRAM cells of the first row for read operations. A second conductive structure is disposed the distance from the edge of the array and is operable to control access to the SRAM cells of the second row for read operations.

In an example method for fabricating an array of SRAM cells, a first communication path that is disposed a first distance from an edge of the array is formed. The first communication path is operable to control access to SRAM cells of a first row of the array for write operations. A second communication path that is disposed a second distance from the edge of the array is formed. The second communication path is operable to control access to SRAM cells of a second row of the array for write operations. A first conductive structure that is disposed a third distance from the edge of the array is formed, where the first conductive structure is operable to control access to the SRAM cells of the first row for read operations. A second conductive structure that is disposed the third distance from the edge of the array is formed, where the second conductive structure is operable to control access to the SRAM cells of the second row for read operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An array of static random access memory (SRAM) cells arranged in rows and columns, the array comprising:
a first ground signal line disposed at an edge of the array, the first ground signal line providing a ground signal to SRAM cells in a first row;
a first communication path disposed at a first distance from the edge of the array and operable to control access to the SRAM cells of the first row of the array for write operations;
a second communication path disposed at a second distance from the edge of the array and operable to control access to SRAM cells of a second row of the array for write operations, the second distance being different than the first distance;
a first conductive structure operable to control access to the SRAM cells of the first row for read operations, the first conductive structure disposed along a first border between the first and second rows in the array, the first border located at a third distance from the edge of the array;
a second conductive structure operable to control access to the SRAM cells of the second row for read operations, the second conductive structure disposed along the first border; and
a second ground signal line disposed at a second border between the second row of the array and a third row of the array, the second ground signal line providing the ground signal to the SRAM cells of the second row,
wherein the first and second ground signal lines extend in a direction parallel to and in a same conductive layer as the first and second communication paths and the first and second conductive structures.

2. The array of claim 1, wherein
the first communication path comprises a first write word line (WWL), and
the second communication path comprises a second WWL.

3. The array of claim 1, wherein the first and second conductive structures are disposed on a boundary that separates the first row from the second row.

4. The array of claim 1, wherein the first conductive structure is disposed entirely within a first column of the array, and wherein the second conductive structure is disposed entirely within a second column of the array.

5. The array of claim 1, wherein the first, second, and third distances are in a first direction, and wherein the first and second conductive structures have a same width extending in the first direction.

6. The array of claim 1,
wherein the first communication path and the second communication path comprise first and second metal lines, respectively, and
wherein the first and second conductive structures have lengths that are less than those of the first and second metal lines.

7. The array of claim 6, wherein the first and second metal lines have widths that are greater than those of the first and second conductive structures.

8. The array of claim 1, wherein the third distance is greater than the first distance and less than the second distance.

9. The array of claim 1, wherein the first communication path, the second communication path, the first conductive structure, and the second conductive structure are disposed in a same conductive layer.

10. The array of claim 1, wherein the first ground signal line connects to VSS nodes of the SRAM cells of the first row of the array, the first ground signal line extending across at least first and second columns of the array.

11. The array of claim 1, further comprising:
a plurality of VSS islands connected to VSS nodes of the SRAM cells of the first row of the array, at least ones of the VSS islands being disposed a fourth distance from the edge of the array.

12. The array of claim 11, wherein the plurality of VSS islands are formed in a same conductive layer as the first communication path, the second communication path, the first conductive structure, and the second conductive structure.

13. An array of static random access memory (SRAM) cells arranged in rows and columns, the array comprising:
a first ground signal line disposed at an edge of the array, the first ground signal line providing a ground signal to SRAM cells in a first row;
a first communication path operable to control access to the SRAM cells of the first row of the array for write operations;
a second communication path operable to control access to SRAM cells of a second row of the array for write operations;
a first conductive structure operable to control access to the SRAM cells of the first row for read operations, the first conductive structure disposed along a first border between the first and second rows in the array, the first border located at a distance from an edge of the array;
a second conductive structure operable to control access to the SRAM cells of the second row for read operations, the second conductive structure disposed along the first border; and
a second ground signal line disposed at a second border between the second row of the array and a third row of the array, the second ground signal line providing the ground signal to the SRAM cells of the second row,
wherein the first and second ground signal lines extend in a direction parallel to and in a same conductive layer as the first and second communication paths and the first and second conductive structures.

14. The array of claim 13, wherein
the first communication path comprises a first write word line (WWL), and
the second communication path comprises a second WWL.

15. The array of claim 13, wherein the first ground signal line connects to VSS nodes of the SRAM cells of the first row of the array, the first ground signal line extending across at least first and second columns of the array.

16. The array of claim 13, further comprising:
a plurality of VSS islands connected to VSS nodes of the SRAM cells of the first row of the array.

17. The array of claim 13, wherein the first communication path, the second communication path, the first conductive structure, and the second conductive structure are formed in a first conductive layer, the array further comprising:

a second conductive layer including a plurality of VSS islands, wherein the first conductive layer (i) is formed over the second conductive layer, and (ii) connects to portions of the second conductive layer using vias.

18. A method of fabricating an array of static random access memory (SRAM) cells, the method comprising:

forming a first ground signal line disposed at an edge of the array, the first ground signal line providing a ground signal to SRAM cells in a first row;

forming a first write word lien that is disposed a first distance from the edge of the array;

forming a second write word line that is disposed a second distance from the edge of the array;

forming a first conductive structure that is disposed along a first border between the first and second rows in the array, the first border located at a third distance from the edge of the array, the first conductive structure being operable to control access to SRAM cells of the first row of the array for read operations;

forming a second conductive structure that is disposed along the border, the second conductive structure being operable to control access to the SRAM cells of a second row of the array for read operations, and the first and second conductive structures being disposed on a boundary that separates the first row from the second row; and forming a second ground signal line disposed at a second border between the second row of the array and a third row of the array, the second ground signal line providing the ground signal to the SRAM cells of the second row, wherein the first and second ground signal lines extend in a direction parallel to and in a same conductive layer as the first and second write word lines and the first and second conductive structures.

19. The array of claim 1, wherein the second row is different than the first row.

20. The method of claim 18, wherein the first conductive structure is disposed entirely within a first column of the array, and wherein the second conductive structure is disposed entirely within a second column of the array.

* * * * *